United States Patent
Waitl et al.

(10) Patent No.: US 8,110,437 B2
(45) Date of Patent: Feb. 7, 2012

(54) METHOD FOR ATTACHING A SEMICONDUCTOR CHIP IN A PLASTIC ENCAPSULANT, OPTOELECTRONIC SEMICONDUCTOR COMPONENT AND METHOD FOR THE PRODUCTION THEREOF

(75) Inventors: Gunter Waitl, Regensburg (DE); Georg Bogner, Lappersdorf (DE); Michael Hiegler, Regensburg (DE); Matthias Winter, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 377 days.

(21) Appl. No.: 10/514,461

(22) PCT Filed: May 14, 2003

(86) PCT No.: PCT/DE03/01557
§ 371 (c)(1), (2), (4) Date: May 20, 2005

(87) PCT Pub. No.: WO03/098706
PCT Pub. Date: Nov. 27, 2003

(65) Prior Publication Data
US 2005/0214968 A1    Sep. 29, 2005

(30) Foreign Application Priority Data
May 16, 2002 (DE) ................... 102 21 857

(51) Int. Cl.
*H01L 21/00* (2006.01)

(52) U.S. Cl. .......... 438/106; 438/26; 438/121; 438/124; 438/127; 257/E21.001

(58) Field of Classification Search ........... 438/25, 438/26, 27, 28, 55, 63, 64, 65, 66, 67, 106; 257/E21.001
See application file for complete search history.

(56) References Cited

U.S. PATENT DOCUMENTS

| | | | |
|---|---|---|---|
| 4,339,768 A | | 7/1982 | Keller et al. |
| 4,677,741 A | * | 7/1987 | Takahama ............... 29/832 |
| 4,858,073 A | | 8/1989 | Gregory |
| 4,929,516 A | * | 5/1990 | Pryor et al. ............. 428/620 |
| 5,200,367 A | | 4/1993 | Ko |
| 5,794,839 A | | 8/1998 | Kimura et al. |
| 6,066,861 A | * | 5/2000 | Hohn et al. .............. 257/99 |

(Continued)

FOREIGN PATENT DOCUMENTS
CN    1292154 A    4/2001
(Continued)

OTHER PUBLICATIONS

Kloeser, J. et al., "Reliability Investigations of SN/PB and Free Solders for Flip Chip Technology", *Pan Pacific Microelectronics Symposium*, pp. 93-102, XP008021531, 1998.
(Continued)

*Primary Examiner* — Angel Roman
(74) *Attorney, Agent, or Firm* — Fish & Richardson P.C.

(57) ABSTRACT

A radiation-emitting or -receiving semiconductor chip 9 is soft-soldered for mounting on a leadframe 2 over which a prefabricated plastic encapsulant 5, a so-called premolded package, is injection-molded. Through the use of a low-melting solder 3 applied in a layer thickness of less than 10 μm, the soldering process can be carried out largely without thermal damage to the plastic encapsulant 5.

35 Claims, 4 Drawing Sheets

U.S. PATENT DOCUMENTS

| | | | |
|---|---|---|---|
| 6,083,772 A * | 7/2000 | Bowman et al. | 438/106 |
| 6,220,764 B1 | 4/2001 | Kato et al. | |
| 6,246,123 B1 * | 6/2001 | Landers et al. | 257/787 |
| 6,282,352 B1 * | 8/2001 | Kato et al. | 385/92 |
| 6,300,169 B1 * | 10/2001 | Weiblen et al. | 438/127 |
| 6,372,551 B1 | 4/2002 | Huang | |
| 6,518,162 B2 | 2/2003 | Ono et al. | |
| 6,624,491 B2 | 9/2003 | Waitl et al. | |
| 6,643,919 B1 * | 11/2003 | Huang | 29/827 |
| 6,852,567 B1 * | 2/2005 | Lee et al. | 438/106 |
| 2001/0022390 A1 | 9/2001 | Waitl et al. | |
| 2001/0029095 A1 * | 10/2001 | Tadauchi et al. | 438/612 |
| 2002/0153608 A1 * | 10/2002 | Okada et al. | 257/737 |
| 2003/0215981 A1 * | 11/2003 | Strouse et al. | 438/118 |
| 2006/0017143 A1 * | 1/2006 | Shimanuki et al. | 257/678 |
| 2007/0287265 A1 * | 12/2007 | Hatano et al. | 438/458 |

FOREIGN PATENT DOCUMENTS

| | | |
|---|---|---|
| DE | 4135189 | 5/1992 |
| DE | 10124141 | 4/2001 |
| EP | 0 401 017 | 12/1990 |
| EP | 1 313 184 | 5/2003 |
| JP | 58064052 | 4/1983 |
| JP | 60081884 | 5/1985 |
| JP | 61-72210 | 4/1986 |
| JP | 8-181392 | 7/1996 |
| JP | 11-121920 | 4/1999 |
| JP | 11-220218 | 8/1999 |
| JP | 11-298048 | 10/1999 |
| JP | 11-307875 | 11/1999 |
| JP | 2001-111116 | 4/2001 |
| JP | 2001-223391 | 8/2001 |
| JP | 2001-284696 | 10/2001 |
| JP | 2002-83835 | 3/2002 |
| JP | 2002-115076 | 4/2002 |
| JP | 2002-118294 | 4/2002 |
| WO | WO 02/07275 | 1/2002 |
| WO | WO 02/27789 | 4/2002 |

OTHER PUBLICATIONS

Chinese Office Action for Patent Application No. 038110830.0 dated Jun. 6, 2008.

Translation of the Reason for Rejection for Japanese Patent Application No. 2004-506099 dated May 27, 2009.

Examination Report for Japanese Patent Application No. 2004-506099 dated Mar. 18, 2010.

* cited by examiner ized by molding
METHOD FOR ATTACHING A SEMICONDUCTOR CHIP IN A PLASTIC ENCAPSULANT, OPTOELECTRONIC SEMICONDUCTOR COMPONENT AND METHOD FOR THE PRODUCTION THEREOF The invention concerns a method as defined in the preamble to Claim 1 and an optoelectronic semiconductor component as defined in the preamble to Claim 24. It further concerns a method for the production of such an optoelectronic semiconductor component.

BACKGROUND OF THE INVENTION

Radiation-emitting and/or -receiving semiconductor chips are conventionally attached by a gluing process to so-called pre-encapsulated leadframes, which are made by molding over a chip mounting area with a plastic encapsulant.

In the known package designs the semiconductor chip is mounted on the leadframe by gluing, since this eliminates the high temperatures that are necessary for soldering processes and that can damage the plastic encapsulant.

Due to the very good electrical and thermal conductivity required for the connection between the semiconductor chip and the leadframe, especially in the case of high-electrical-output components, a metal connection between the chip and the connector would be preferable over a glued connection. Particularly in the realm of high-output light-emitting diodes, a very good thermal connection is crucial in order to carry off the dissipated power brought in from the package and, where applicable, couple it to an external heat sink. Because of the above-cited potential for damage to the package, solder connections have heretofore not been used between the light-emitting diode (LED) chip and the leadframe in pre-injection-molded plastic encapsulants.

SUMMARY OF THE INVENTION

The object of the instant invention is to develop a method of the kind cited at the beginning hereof by which a semiconductor chip can be attached in a plastic encapsulant by means of a metallic connection between the chip and the connector, and the risk of impairing the functional capability of the plastic encapsulant is simultaneously reduced. A corresponding optoelectronic component and a method for the production thereof is further to be provided.

These objects are achieved by means of a method disclosed herein.

The use of very small amounts of a low-melting solder eliminates excessive heating of the metal parts contacted by the plastic encapsulant, which contains a thermoplast and/or a duroplast and is preferably made of a thermoplast. Especially preferred as thermoplasts are high-temperature thermoplasts such as PPA, polysulfone and LPC (liquid crystal polymer). The thermoplasts are preferably filled with titanium dioxide, glass fibers, mineral fillers and similar filler materials. A solder layer is preferably used that allows the soldering to be performed at temperatures of between 200 and 260° C. At the same time, the use of soft solder, as opposed to hard solder, largely prevents warping of the soldered chip, which can lead to chip damage.

The connector advantageously has a first and a second main surface. In a particularly advantageous variant of the method, the first and second main surfaces are enveloped by the plastic encapsulant, in which case the first and/or the second main surface border are directly adjacent the plastic encapsulant.

The low-melting soft solder used can be pure tin, an alloy whose principal component is tin, or alloys having a eutectic composition, such as AgSn, CuSn, PbSn or InPb or a mixture of these alloys. If an alloy is used as solder, it is advantageous to select the composition of the alloy so that it is to the greatest possible extent at the eutectic composition of the two- or multi-material system concerned, so that the melting point of the alloy is as low as possible.

It is advantageous if a thin layer is deposited locally on the points to be soldered, in a thickness of between 1 and 10 µm. It is particularly advantageous if a layer with a thickness of between 2 to 5 µm is deposited. This prevents wetting of the side surfaces of the LED chip on the side facing the leadframe, which in the case of flip-chip assembly (see below) would easily cause a short circuit of the active epitaxial layer sequence.

The thin layers of solder can preferably be deposited by conventional methods, such as vapor deposition, sputtering, etc.

If the solder is deposited on the leadframe, this preferably takes place before the leadframe is molded over with the plastic encapsulant.

It is particularly advantageous if thin layers of the individual components of an alloy are deposited repeatedly in alternation. Here again, the total thickness of the layer stack is advantageously between 1 and 10 µm or 2 and 5 µm.

The metals of the thin layers intermingle during the soldering process owing to the short diffusion paths to the respective adjacent layers. The rapid melting of the solder and thus the rapid soldering of chip and connector advantageously have the effect that the plastic encapsulant of the premolded package need be exposed to an elevated temperature for only a short period of time, and its functional capability is therefore is largely unimpaired.

Because of the short soldering time in combination with the low temperatures of the soldering process, it is therefore feasible to solder LED chips to leadframes in premolded packages, that is, to provide LED chips with metallic connections between the chip and the connector.

To prevent an oxide layer from forming on the solder or the to-be-soldered surfaces while the solder is being heated, it is advantageous, after depositing the solder on a surface for soldering, to apply a thin layer of gold to the solder and/or to the surfaces of the chip and leadframe that are to be soldered.

Low processing temperatures allow the chip to be soldered largely without warping.

The tiny volume of solder used makes it possible in particular to solder chips with the active epitaxial layer sequence facing the connector. This so-called "flip-chip" arrangement, also known as "face-down" or "top-down" assembly, is made feasible only by virtue of the very small volume of solder according to the technical teaching of the invention.

Wetting of the side walls of the chip also occurs in conventional gluing processes. This is why it is difficult in flip-chip assembly to mount a chip on a leadframe or another electrically conductive connector via a gluing process.

Especially with the use of conventional, silver-particle-filled conductive adhesives, there is also the problem that silver particles migrate relatively intensively in an electric field when moisture is present. This is the case in particular with infrared sensors and infrared radiators, which need high voltages to operate. To address this problem, in these cases gold particles are often used as conductive filler in conventional schemes.

In contradistinction to this, the use of soft solder is far more cost-effective.

Advantageous improvements and embodiments of the method according to the invention and the optoelectronic component are recited in the dependent claims.

BRIEF DESCRIPTION OF THE DRAWINGS

Further advantages and preferred embodiments of the method of the invention and the optoelectronic component will emerge from the following embodiment examples described in greater detail in connection with FIGS. 1 to 8.

Therein.

DETAILED DESCRIPTION OF THE PREFERRED EMBODIMENTS

Figure 1:
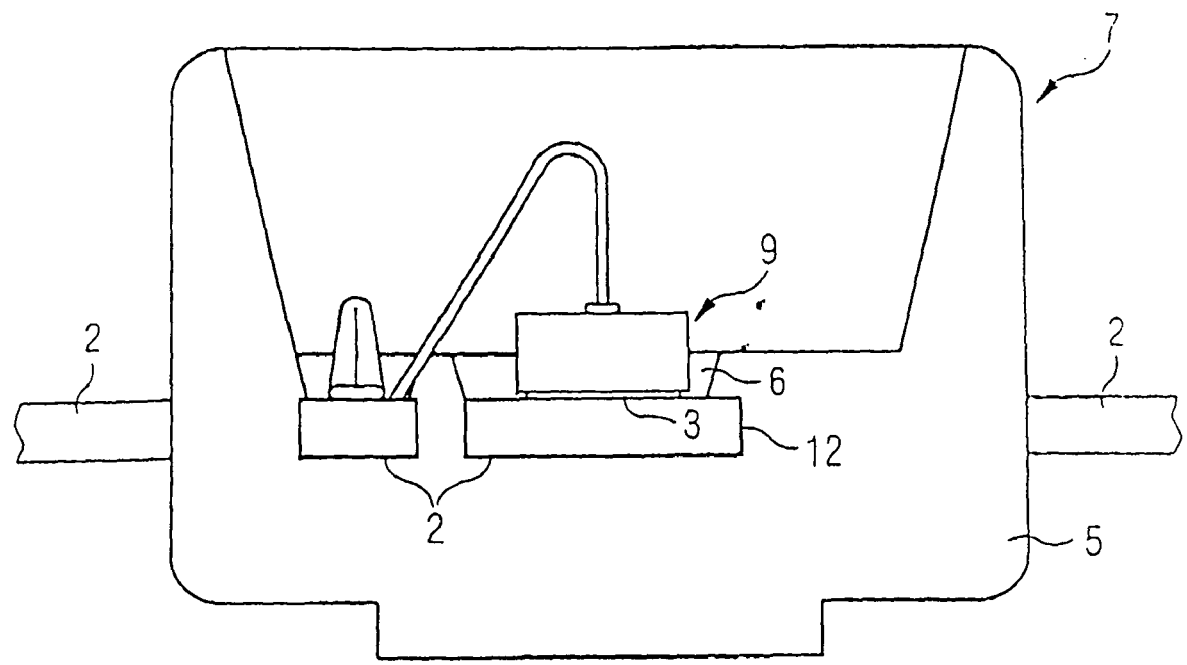
FIG. 1 is a schematic diagram of an optoelectronic component comprising a chip that is mounted by the method of the invention.

The embodiment example depicted in FIG. 1 comprises a leadframe 2 around which a plastic encapsulant 5 has been compression- or injection-molded and which comprises a first and a second main surface (premolded package). In a recess 6 in this plastic encapsulant 5 that leads from outside the base encapsulant to the leadframe 2, an LED chip 9 is attached to a connector 12 of the metal leadframe 2 by means of a soft solder. The first and second main surfaces of the leadframe are covered with plastic. Thus, there is substantially no additional heat sink apart from the leadframe.

A metallization layer 22 deposited on plastic encapsulant 5 and comprising a connector 12 can alternatively be provided instead of the leadframe. As a further alternative, a heat sink embedded in the plastic encapsulant can serve as the connector. A solder layer 3 between LED chip 9 and connector 12 preferably has a thickness of between 1 and 10 µm. Especially preferably, the solder layer has a thickness of between 2 and 5 µm. The soft solder in this embodiment example is composed substantially of pure tin or of an alloy whose principal component is tin. The solder material for soft soldering can also, for example, be an alloy whose material system has a eutectic composition. Candidates for this purpose are AgSn, CuSn, PbSn or InPb or a mixture or layer sequence composed of at least two of these alloys. The plastic encapsulant contains a thermoplast, preferably a high-temperature thermoplast such as PPA. Polysulfone or LCPs (liquid crystal polymers) can also be used. Improved temperature resistance can be achieved by means of filler materials such as, for example, glass fibers, mineral fillers and $TiO_2$. The plastic encapsulant can also, however, contain a duroplast.

Figure 2:
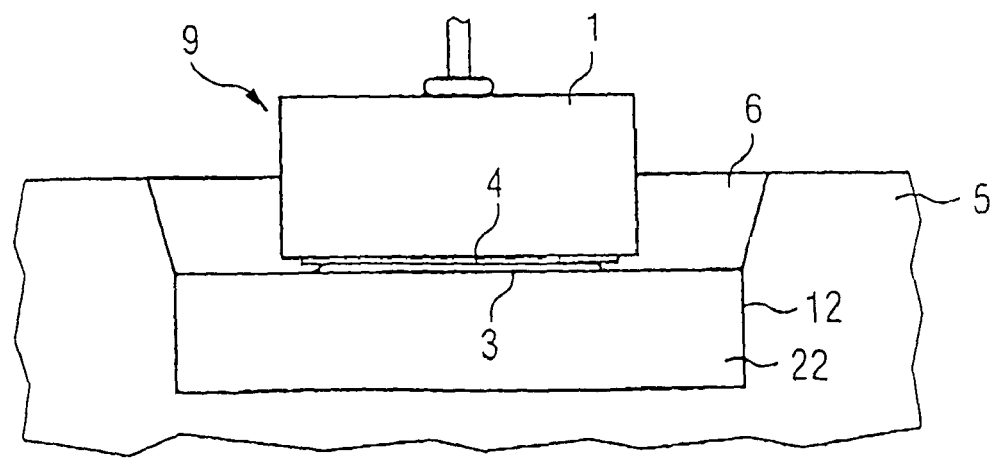
FIG. 2 is a schematic diagram of an optoelectronic component comprising a chip that is flip-chip-mounted by the method of the invention.

The second embodiment example, depicted in FIG. 2, differs from the example just described in that the LED chip 9, in a flip-chip assembly (see above), is attached to a connector by means of a soft solder. The connector in this case is a metallization layer 22 vapor-deposited on the base encapsulant 5, but it can also, as in the first-cited case, be part of a leadframe. Due to the minuscule thickness of the solder, it is not pressed out from under the chip 9. The risk of short-circuiting the epitaxial layer sequence is greatly reduced.

Figure 3:
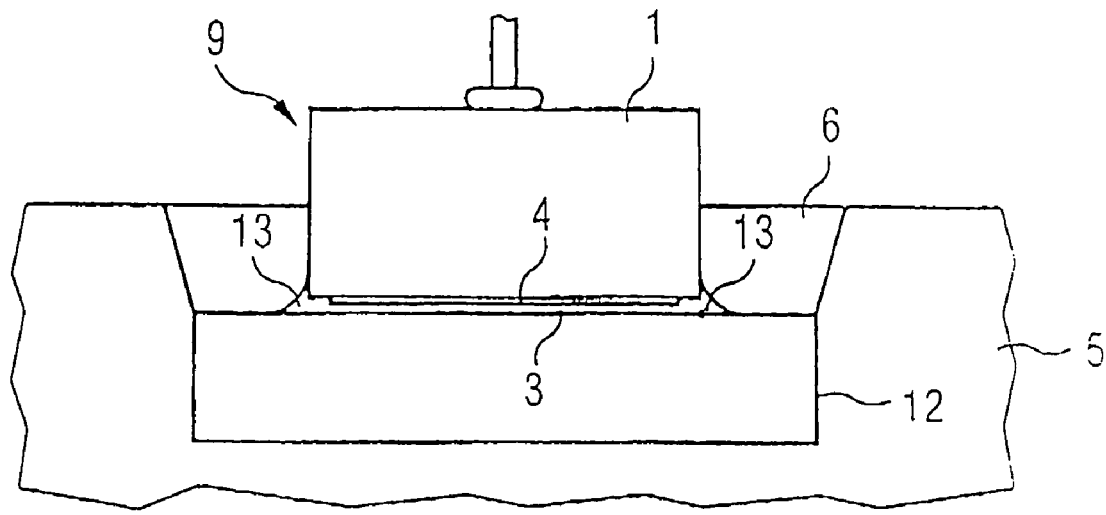
FIG. 3 is a schematic diagram of an optoelectronic component comprising a chip that is flip-chip-mounted by a conventional gluing method.

If solder layers 3 of very large thicknesses are applied, however, there is a risk, as illustrated in FIG. 3, that the solder will be pressed out from under the chip 9 placed on the leadframe 2. This solder wets the connector and the side walls of the chip 9. If the chip 9 is arranged as a flip chip with its active side 4 toward the leadframe 2, the solder, forming a meniscus 13, causes an electrical short circuit from connector 12 to chip substrate 1 of chip 9 at epitaxial layer sequence 4.

Figure 4:
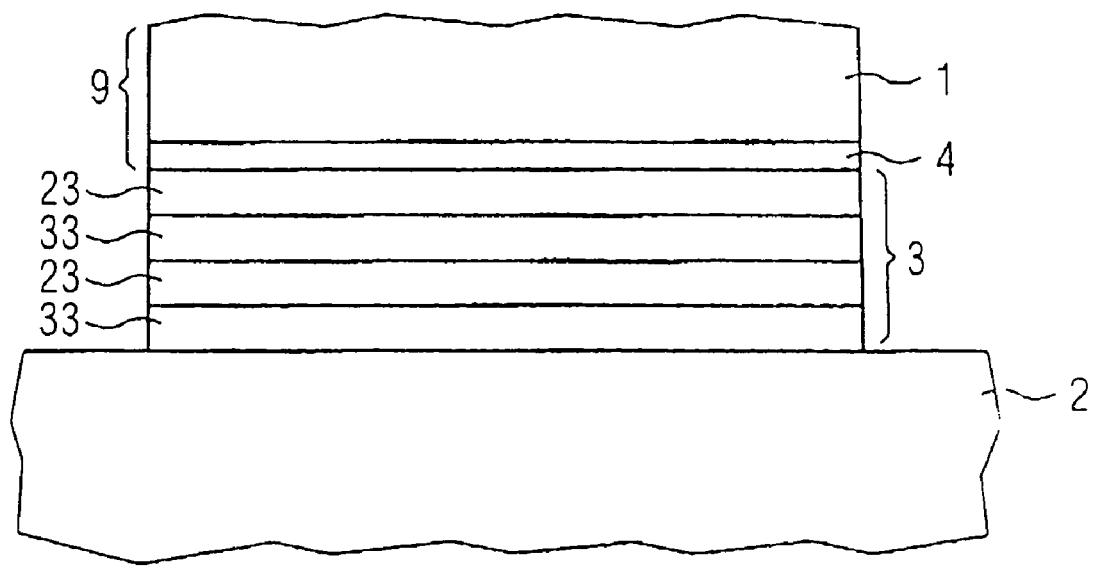
FIG. 4 is a schematic diagram of a solder point prepared by a method according to the invention.

FIG. 4 shows a particularly advantageous option for the arrangement of a solder layer (3) which during the soldering process forms an alloy whose material system has a eutectic composition. Thin layers (23, 33) of the individual components of the alloy are arranged alternatingly between the chip and the connector. Layers (23) are composed, for example, of tin and layers (33) of silver.

Due to the short diffusion paths to the respective adjacent layers, the individual metals intermingle during the soldering process and form an alloy.

Figure 5:
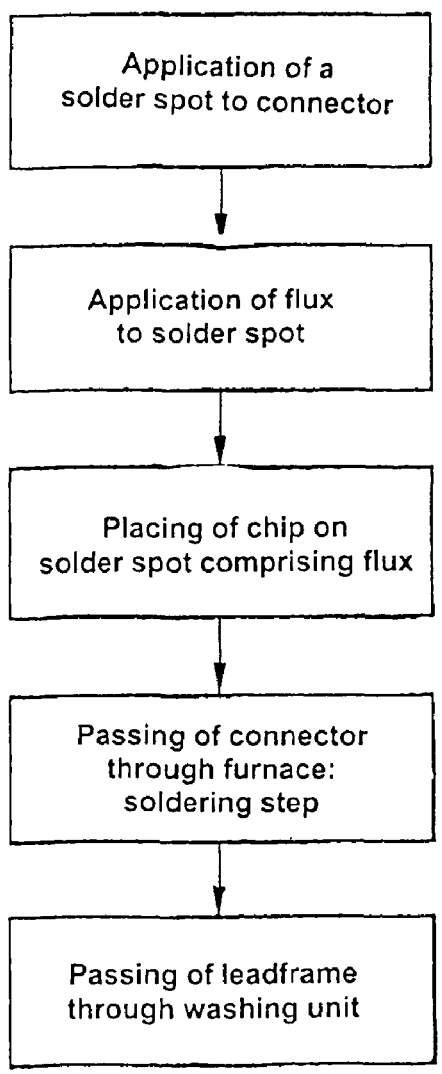
FIG. 5 is a flow chart illustrating the assembly sequence of a first embodiment example of the method according to the invention.

The embodiment example illustrated schematically in FIG. 5 concerns a mounting sequence for soft-soldering an LED chip in a premolded package as described exemplarily in the embodiment example of FIG. 1. A solder layer (for example having a thickness of 2 to 5 µm) composed substantially of tin or of an alloy whose principal component is tin is applied to a connector. The connector can, for example, be a leadframe, a heat sink embedded in the plastic encapsulant or a metallization layer deposited on a plastic encapsulant. In the case of the leadframe, a leadframe can in particular be embedded without the use of a heat sink, so that a first and a second main surface of the leadframe are covered with plastic. Flux is then applied to the solder and the chip is placed thereon. The premolded package then passes, preferably at 200 to 260° C., through a soldering furnace in which the solder connection is produced. Subsequently, the premolded package passes through a washing unit in which the residues, produced mainly by the flux, are rinsed away.

The flux is necessary to remove the oxide layer that forms on the solder and the chip in the through-type furnace and to keep an oxide layer from developing. To prevent the formation on the solder of an oxide layer that would sharply lower the quality of the solder connection, a gold film can also be deposited on the solder prior to the soldering operation.

As an alternative to the procedure described above, the solder layer can be deposited on the leadframe before the production of the plastic encapsulation.

Figure 6:
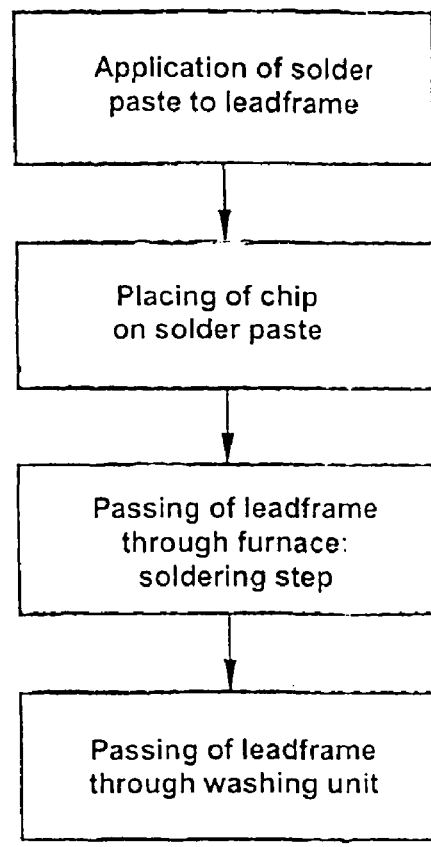
FIG. 6 is a flow chart illustrating the assembly sequence of a second embodiment example of the method according to the invention.

The process according to the second embodiment example, which is illustrated schematically in FIG. 6, differs from the foregoing embodiment example essentially in that solder is used in the form of a solder paste. The solder paste can be applied to the connector alone or to the semiconductor chip alone or to both the connector and the semiconductor chip. An LED chip is placed at the connector site, which has been prepared with solder paste, inside a premolded package before the strip passes through the solder furnace.

To remove the chemicals such as flux that are present in the solder paste, a washing unit is also installed downstream of the soldering furnace in this embodiment example.

Figure 7:
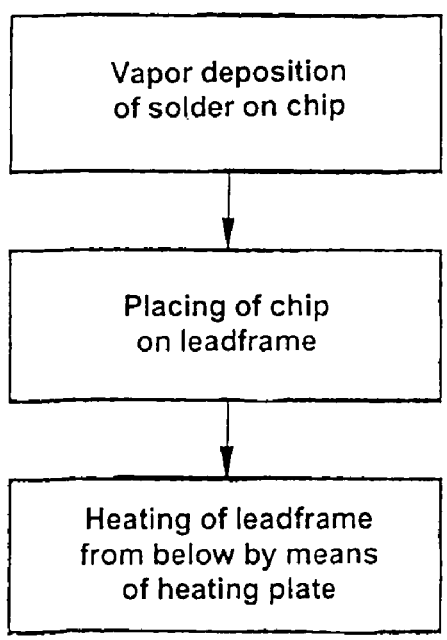
FIG. 7 is a flow chart illustrating the assembly sequence of a third embodiment example of the method according to the invention.

In the method according to the embodiment example of FIG. 7, the solder is applied to the back side of an LED chip by vapor deposition. The solder material used is an alloy whose material system has a eutectic composition. This alloy can be AgSn, CuSn, PbSn, InPb or a mixture of at least two of these alloys. A layer sequence of individual alloys or of individual metals forming these alloys can also be used. The chip is placed on a leadframe inside a premolded package. In contrast to the preceding embodiment example, here the leadframe and the chip are heated by means of a heating plate located under the leadframe in order to melt the soft solder.

Here the soldering is performed without the use of a flux. Consequently, there is no washing unit after the soldering furnace. The soldered semiconductor component 7 is thereby obtained largely without impurities in a particularly frugal manner.

Figure 8:
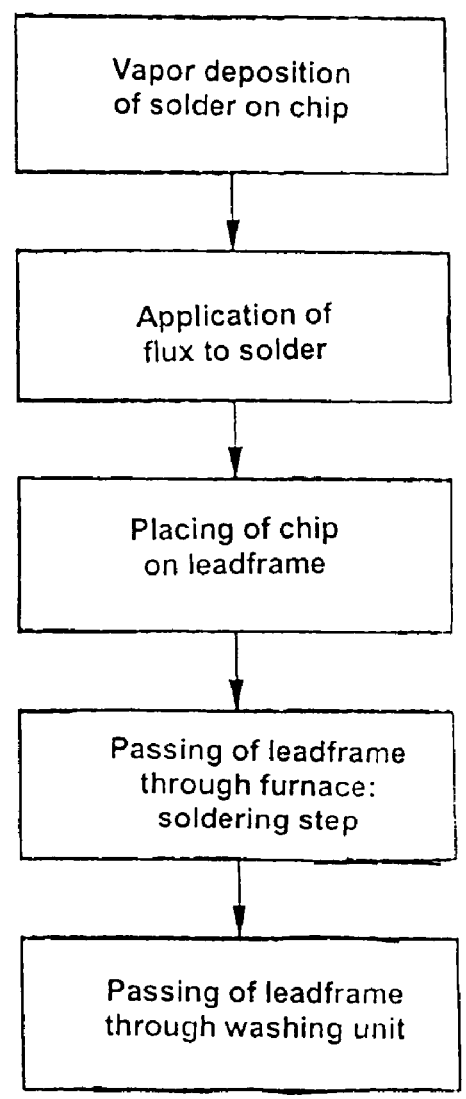
FIG. 8 is a flow chart illustrating the assembly sequence of a fourth embodiment example of the method according to the invention.

In the method according to the embodiment example of FIG. 8, as in the previously described embodiment example, an LED chip with solder vapor-deposited thereon is placed on the leadframe inside a premolded package. After vapor deposition, the solder layer has a thickness of between 1 and 10 µm, preferably between 1 and 5 µm. The plastic encapsulation can be produced on the leadframe by injection molding or compression molding or another molding process for duroplasts or thermoplasts. In this embodiment example, flux is first deposited at the location on the leadframe that is to be soldered. The strip passes through a soldering furnace and then a washing unit. After the soldering operation, the thickness of the solder layer is between 0.1 and 10 µm, preferably between 0.1 and 5 µm.

In all the embodiment examples for the method of the invention, the LED chip can also be attached to the connector in a flip-chip assembly. The vapor deposition of solder on the LED chip then naturally has to be performed not on the back side of the chip, but on the active epitaxial layer sequence of the LED chip.

The connector can be enveloped by the plastic of the plastic encapsulant on two main surfaces, so that no further heat sink is present on the connector.

In addition to its use with radiation-emitting semiconductor chips, the method according to the invention is also, of course, applicable to the soldering of other semiconductor structures such as, in particular, infrared sensors or infrared radiators, as well as transistors.

The invention claimed is:

1. A method, comprising:
  mounting a semiconductor chip on a first surface of a thermally and electrically conductive connector formed entirely of an electrically conductive material and arranged in or on a plastic encapsulant,
  wherein the encapsulant comprises a thermoplast material and a filler material and the encapsulant contacts at least a portion of a surface of the connector opposite the first surface;
  wherein a connection between the chip and the connector is produced by a soft soldering process using a soft solder material, the soft soldering process taking place at a temperature of between 200° C. inclusive and 260° C. inclusive, and a gold film is deposited on the soft solder material before soldering;
  wherein the soft solder material comprises substantially an alloy whose material system has a eutectic composition; and
  wherein layers comprising different components of the alloy are applied to said semiconductor chip and/or to said connector.

2. The method of claim 1, wherein the first surface is a first main surface of the connector and the surface opposite the first surface is a second main surface of the connector.

3. The method of claim 2, wherein said first and second main surfaces are enveloped by said plastic encapsulant.

4. The method of claim 1, wherein said plastic encapsulant comprises a duroplast material.

5. The method of claim 1, wherein said plastic encapsulant is produced by being molded over, particularly injection-molded or compression-molded over, a leadframe and said connector is part of said leadframe.

6. The method of claim 1, wherein said connector is a metallization layer applied to a plastic encapsulant.

7. The method of claim 1, wherein said connector is a heat sink embedded in said plastic encapsulant.

8. The method of claim 1, wherein a solder layer having a thickness of between 1 µm inclusive and 10 µm inclusive is used between said semiconductor chip and said connector.

9. The method of claim 1, wherein a solder layer having a thickness of between 2 µm inclusive and 5 µm inclusive is used between said semiconductor chip and said connector.

10. The method of claim 1, wherein the solder material used is composed substantially of pure tin or of an alloy whose principal component is tin.

11. The method of claim 1, wherein the solder material used is at least one alloy from the group of alloys consisting of AgSn, CuSn, PbSn and InPb or a mixture or layer sequence composed of least two of said alloys.

12. The method of claim 1, wherein the solder material is applied to said chip before soldering.

13. The method of claim 1, wherein the solder material is applied to said connector before soldering.

14. The method of claim 1, wherein said semiconductor chip is attached to said connector with flux before soldering.

15. The method of claim 1, wherein said semiconductor chip is attached to said connector with solder paste before soldering.

16. The method of claim 1, wherein a through-type furnace is used for the soldering operation.

17. The method of claim 1, wherein a heating plate is used for the soldering operation.

18. The method of claim 1, wherein said plastic encapsulant passes through a washing unit after the soldering process.

19. The method of claim 1, wherein the filler material further comprises at least one of mineral fillers and $TiO_2$.

20. The method of claim 1, wherein the filler material comprises glass fibers.

21. An optoelectronic semiconductor component, comprising:
  a radiation-emitting and/or a radiation-receiving semiconductor chip on a thermally and electrically conductive connector formed entirely of an electrically conductive material and arranged in or on a plastic encapsulant,
  wherein the connector comprises a first main surface and a second main surface, the first and second main surfaces being enveloped by the plastic encapsulant;
  wherein the plastic encapsulant comprises a thermoplast material and a filler material;
  wherein a connecting layer between said semiconductor chip and said connector comprises a soft solder having a composition selected so that the soft solder is configured to undergo a soldering process at a temperature of between 200° C. inclusive and 260° C. inclusive, and a gold film deposited on the soft solder;

wherein the soft solder comprises substantially an alloy whose material system has a eutectic composition; and wherein the alloy has a composition selected so that layers comprising different components of the alloy are applied to said semiconductor chip and/or to said connector.

22. The optoelectronic semiconductor component of claim 21, wherein said plastic encapsulant comprises a duroplast material.

23. The optoelectronic semiconductor component of claim 21, wherein said connector is part of a leadframe that is molded over with said plastic encapsulant, particularly by injection molding or compression molding.

24. The optoelectronic semiconductor component of claim 22, wherein said connector is a metallization layer applied to said plastic encapsulant.

25. The optoelectronic semiconductor component of claim 22, wherein said connector is a heat sink embedded in said plastic encapsulant.

26. The optoelectronic semiconductor component of claim 22, wherein a solder layer having a thickness of between 0.1 μm inclusive and 10 μm inclusive is provided between said semiconductor chip and said connector.

27. The optoelectronic semiconductor component of claim 22, wherein a solder layer having a thickness of between 0.1 μm inclusive and 5 μm inclusive is provided between said semiconductor chip and said connector.

28. The optoelectronic semiconductor component of claim 21, wherein said soft solder is composed substantially of pure tin or of an alloy whose principal component is tin.

29. The optoelectronic semiconductor component of claim 22, wherein said soft solder is substantially an alloy whose material system has a eutectic composition.

30. The optoelectronic semiconductor component of claim 29, wherein said soft solder is substantially an alloy selected from the group consisting of AgSn, CuSn, PbSn and InPb or a mixture or layer sequence composed of at least two of said alloys.

31. The optoelectronic semiconductor component of claim 22, wherein said semiconductor chip is attached to said connector in a flip-chip assembly, so that an active epitaxial layer sequence faces said connector.

32. The optoelectronic semiconductor component of claim 31, wherein said soft solder and a contact layer, particularly a contact metallization of said epitaxial layer sequence, are all that is present between said epitaxial layer sequence and said connector.

33. The optoelectronic semiconductor component of claim 21, wherein the filler material further comprises at least one of mineral fillers and $TiO_2$.

34. The optoelectronic semiconductor component of claim 21, wherein the filler material comprises glass fibers.

35. A method, comprising:
mounting a semiconductor chip on a first surface of a thermally and electrically conductive connector formed entirely of an electrically conductive material and arranged in or on a plastic encapsulant,
wherein the encapsulant comprises a thermoplast material and a filler material and the encapsulant contacts at least a portion of a surface of the connector opposite the first surface;
wherein a connection between the chip and the connector is produced by a soft soldering process using a soft solder material, the soft soldering process taking place at a temperature of between 200° C. inclusive and 260° C. inclusive;
wherein said semiconductor chip is attached to said connector with flux before soldering; and
wherein said plastic encapsulant passes through a washing unit after the soldering process.

* * * * *